(12) United States Patent
Imamura et al.

(10) Patent No.: US 6,763,026 B2
(45) Date of Patent: Jul. 13, 2004

(54) MEMORY USED IN PACKET SWITCHING NETWORK FOR SUCCESSIVELY STORING DATA BITS IN DATA STORAGE REGION AND SERIALLY OUTPUTTING DATA BITS AND METHOD USED THEREIN

(75) Inventors: Masahiro Imamura, Tokyo (JP); Masanobu Arai, Tokyo (JP)

(73) Assignee: NEC Corporation, Tokyo (JP)

( * ) Notice: Subject to any disclaimer, the term of this patent is extended or adjusted under 35 U.S.C. 154(b) by 57 days.

(21) Appl. No.: 09/968,990

(22) Filed: Oct. 3, 2001

(65) Prior Publication Data

US 2002/0039361 A1 Apr. 4, 2002

(30) Foreign Application Priority Data

Oct. 4, 2000 (JP) ........................................ 2000-304298

(51) Int. Cl.[7] .............................................. H04L 12/54
(52) U.S. Cl. .................................... 370/395.7; 370/428
(58) Field of Search ............................. 370/395.1, 366, 370/395.7, 395.71, 395.72, 412, 413, 415, 417, 428, 429; 711/100, 147, 154

(56) References Cited

U.S. PATENT DOCUMENTS

| 4,987,559 | A | * | 1/1991 | Miyauchi et al. | ....... 365/189.04 |
|---|---|---|---|---|---|
| 5,991,267 | A | * | 11/1999 | Monzawa et al. | ..... 370/395.42 |
| 6,047,344 | A | * | 4/2000 | Kawasumi et al. | ......... 710/107 |
| 6,055,248 | A | * | 4/2000 | Kobayashi | .................. 370/517 |
| 6,370,162 | B1 | * | 4/2002 | Takahashi et al. | .......... 370/517 |
| 6,449,277 | B1 | * | 9/2002 | Kim | ...................... 370/395.61 |

FOREIGN PATENT DOCUMENTS

JP        6-266638        9/1994

* cited by examiner

*Primary Examiner*—Kwang Bin Yao
(74) *Attorney, Agent, or Firm*—Young & Thompson

(57) ABSTRACT

Packets are accumulated in a packet transmission memory, and the data bits stored in each packets are serially output from the packet transmission memory, wherein an internal bit address signal is sequentially changed in the packet transmission memory so as to store the serial data bits in an addressable data storage region without any serial-to-parallel data conversion, and the data bits are serially output from a built-in parallel-to-serial data converter connected to the data storage regions, thereby making the circuit arrangement simple.

11 Claims, 5 Drawing Sheets

MEMORY USED IN PACKET SWITCHING NETWORK FOR SUCCESSIVELY STORING DATA BITS IN DATA STORAGE REGION AND SERIALLY OUTPUTTING DATA BITS AND METHOD USED THEREIN

FIELD OF THE INVENTION

This invention relates to a memory used in a packet switching network and, more particularly, to a packet transmission memory for storing and outputting data bits through a data conversion between a serial data and a parallel data and a method used therein.

DESCRIPTION OF THE RELATED ART

A packet switching network is used in an information store and forward exchanging service. A piece of information to be transmitted is divided into plural data blocks, and an address representative of the destination is added to each of the plural data blocks. Each data block and the address are stored in a packet, and the packets are transmitted through the packet switching network to the destination.

In the packet switching network, the communication lines are shared among plural terminals, and, accordingly, the packet forming a part of the piece of information concurrently flows through the communication lines together with packets forming parts of other pieces of information. In order to prevent a packet from concurrent occupation with another packet, the packets are temporarily stored in a memory, and are read out from the memory at an appropriate timing. The packet is transferred through the packet switching network in the form of a serial bit string, and is stored at a data storage region in the memory in the form of parallel bits. The memory is hereinbelow referred to as "packet transmission memory".

A typical example of the packet transmission memory has plural addressable data storage regions, and 512 bits are storable in each of the addressable data storage regions. The packet or the serial bit string is supplied to the data input port of the packet transmission memory, and is stored in one of the addressable data storage regions. A serial-to-parallel data conversion is required for the packet transmission memory.

A packet transmission memory is disclosed in Japanese Patent Application laid-open No. 6-266638. The prior art packet transmission memory internally converts a digital data signal between serial bits and parallel bits. FIG. 1 shows the prior art packet transmission memory disclosed in the Japanese Patent Application laid-open. The prior art packet transmission memory 6 is integrated on a semiconductor chip, and is connected between a communication network 200 and a MCU (Micro Controller Unit) 7. The prior art packet transmission memory 6 comprises a main controlling circuit 61, an 8-bit configuration RAM (Random Access Memory) block 62, a counter 63, a signal reception controller 64, a signal transmission controller 65, a data register 66 and an address register 67. The main controlling circuit 61 supervises the RAM 62, the signal reception controller 64 and the signal transmission controller 65, and controls data write-in operation/data read-out operation on the RAM 62, a data reception from the network 200 and a data transmission to the network 200.

Though not shown in FIG. 1, the RAM 62 includes a memory cell array, a read-out shift register and a write-in shift register. The memory cells are arranged into plural rows. The read-out shift register has a data storage capacity equal to the row of memory cells, and the write-in shift register also has the data storage capacity equal to the row of memory cells. A digital data signal representative of a piece of write-in data is supplied in serial from the signal reception controller 64 to the write-in shift register, and the data bits of the digital data signal are successively stored in the write-in shift register. When one of the rows of memory cells is selected from the memory cell array, the stored data bits are output in parallel from the write-in shift register to the selected row of memory cells, and are stored therein. When the piece of data is accessed, the data bits are read out in parallel from the row of memory cells to the read-out shift register, and are concurrently stored in the read-out shift register. The data bits are serially supplied from the read-out shift register to the signal transmission controller 65.

A problem is encountered in that the RAM 62 consumes a wide real estate on the semiconductor chip.

SUMMARY OF THE INVENTION

It is therefore an important object of the present invention to provide a packet transmission memory which is integrated on a relatively narrow real estate on a semiconductor chip.

To accomplish the object, the present invention proposes to directly write serial data bits in an addressable data storage region of a memory.

In accordance with one aspect of the present invention, there is provided a memory for readably storing data bits of packets therein comprising plural addressable data storage regions each having plural memory cells, a data distributing circuit connected to the plural addressable data storage regions and responsive to an internal address signal selectively specifying the plural memory cells of an addressable data storage region selected from the plural addressable data storage regions for providing a data path to the memory cell specified by the internal bit address signal, a data write-in unit responsive to an external address signal for selectively enabling the plural addressable data storage regions and successively transferring the data bits of a received packet to the data distributing circuit, an internal address generator synchronously cooperating with the data write-in unit for supplying the internal address signal to the data distributing circuit, and a parallel-to-serial converter connected to the plural addressable data storage regions, storing the data bits read out from an addressable data storage region selected from the plural addressable data storage regions, and serially outputting the data bits to the outside.

In accordance with another aspect of the present invention, there is provided a method for writing data bits of a packet in and reading out the data bits from a data storage region having memory cells of a memory, and the method comprises the steps of a) selecting the data storage region from the memory, b) receiving the first data bit of the packet, c) providing a data path to one of the memory cells of the data storage region for storing the first data bit in the aforesaid one of the memory cells, d) receiving the next data bit of the packet, e) changing the data path from the aforesaid one of the memory cells to another of the memory cells for storing the next data bit in the aforesaid another of the memory cells, f) repeating the steps d) and e) until the last data bit is stored in a memory cell of the data storage region, g) concurrently reading out the data bits of the packet from the memory cells of the data storage region, h) storing the data bits in a parallel-to-serial converter and i) serially outputting the data bits from the parallel-to-serial converter.

BRIEF DESCRIPTION OF THE DRAWINGS

The features and advantages of the packet transmission memory will be more clearly understood from the following description taken in conjunction with the accompanying drawings in which.

DESCRIPTION OF THE PREFERRED EMBODIMENTS

Figure 1:
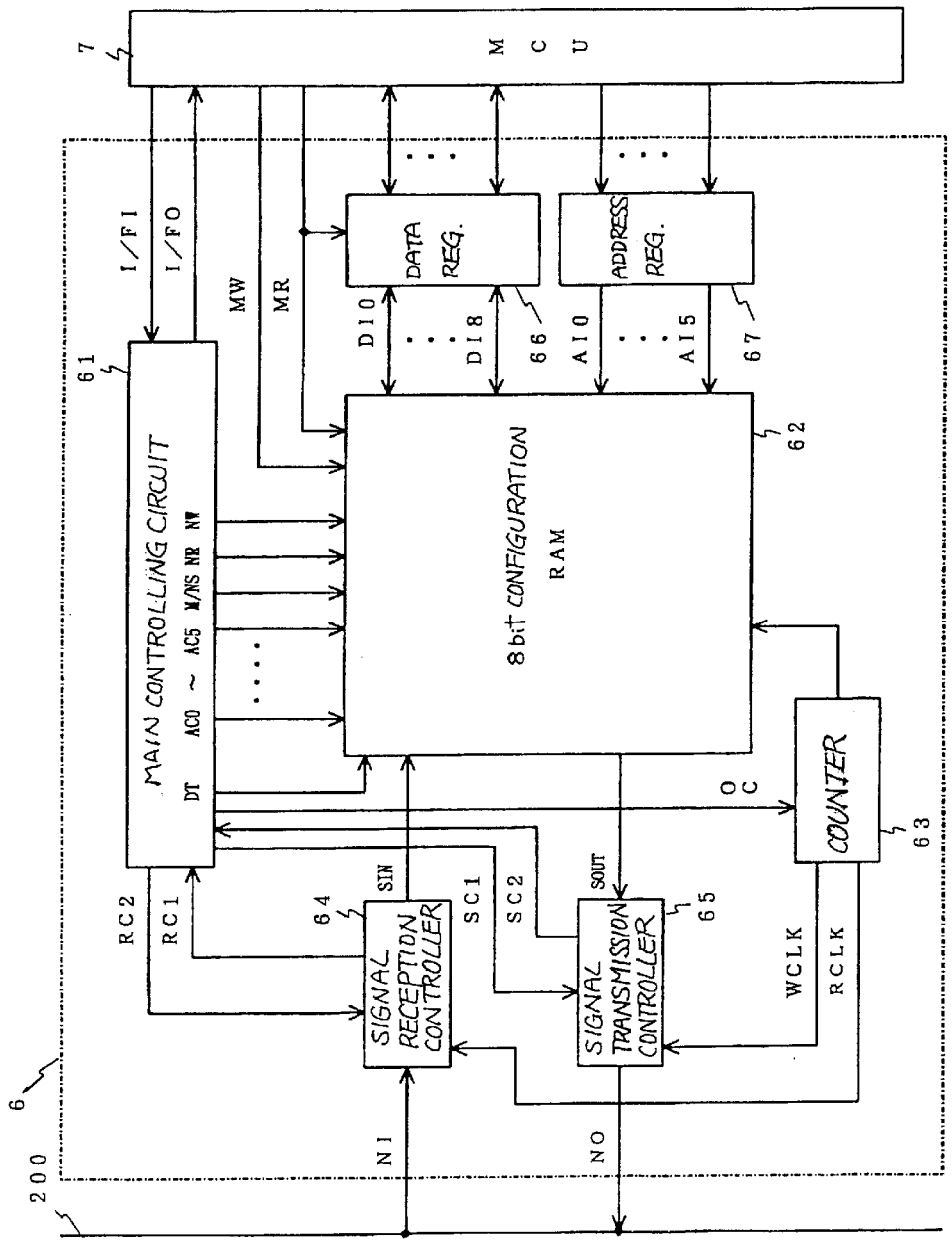
FIG. 1 a block diagram showing the arrangement of the prior art packet transmission memory disclosed in the Japanese Patent Application laid-open.
Figure 2:
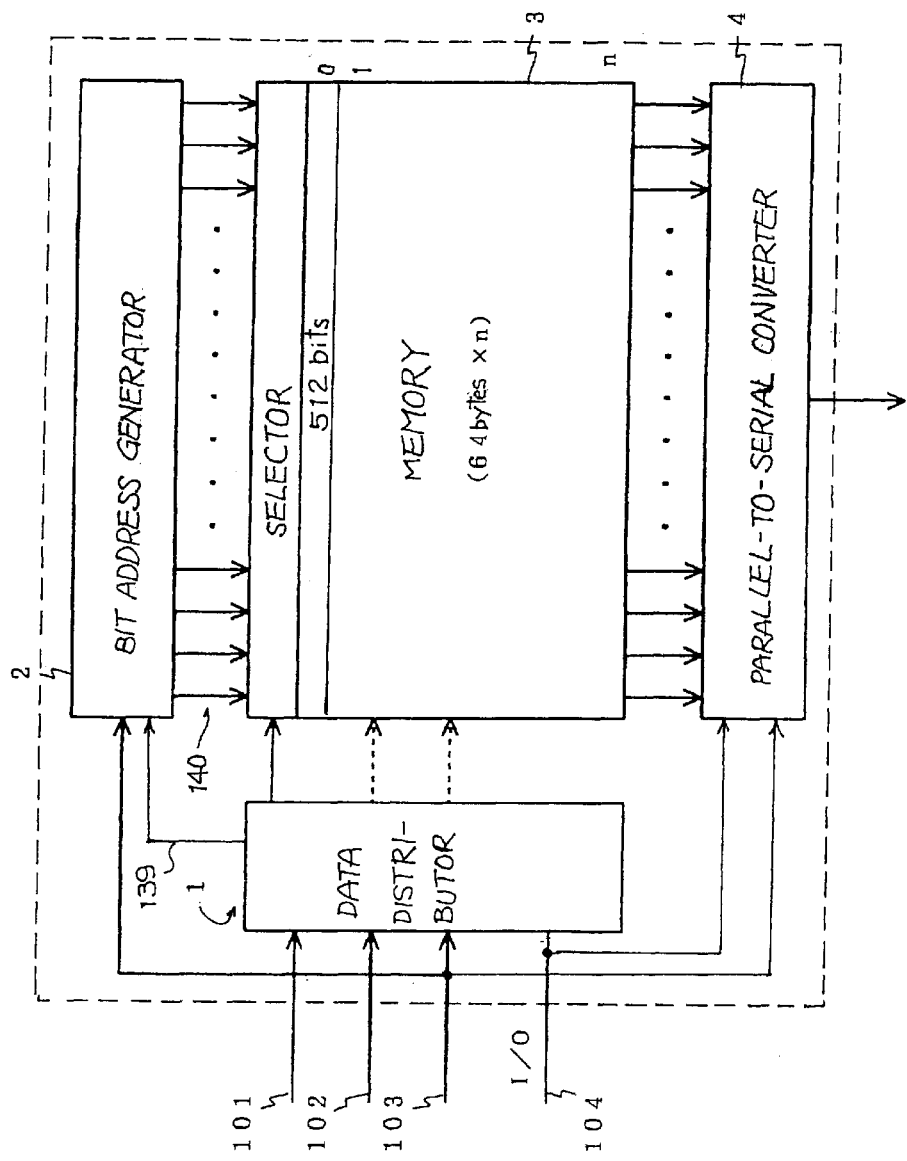
FIG. 2 is a block diagram showing the arrangement of a packet transmission memory according to the present invention.

Referring to FIG. 2 of the drawings, a packet transmission memory embodying the present invention largely comprises a data distributor 1, a bit address generator 2, a memory 3 and a parallel-to-serial converter 4. In this instance, the packet transmission memory is integrated on a semiconductor chip.

A digital signal 101, an address signal 102, a clock signal 103 and a control signal 104 are supplied to the data distributor 1. The digital signal 101 is supplied to the data distributor 1 in the form of serial bits, and the data bits are supplied to the memory 3 in synchronism with the clock pulses of the clock signal 103. The address signal 102 is indicative of a data storage region in the memory 3, and the data distributor 1 renders the selected data storage region ready for access. In this instance, the data storage region accepts 64 bytes or 512 bits. When the address signal 102 changes the address assigned to the data storage regions, the data distributor 1 produces a reset signal 139, and supplies the reset signal 139 to the bit address generator 2. The control signal 104 is representative of the mode of operation, i.e., a data write-in mode and a data read-out mode. When the control signal 104 is indicative of the data write-in operation, the data distributor 1 distributes the data bits to the addressable memory cells of the selected data storage region. However, while the control signal 104 is indicative of the data read-out operation, the data distributor 1 does not distribute the data bits.

The clock signal 103 is further supplied to the bit address generator 2. As described hereinbefore, the data storage region has 512 addressable memory cells. When the reset signal 139 is changed to the active level, the bit address generator 2 changes a bit address signal 140 to the initial bit address 0. The bit address generator 2 is responsive to the clock signal 103 so as sequentially to increment the bit address signal 140. The bit address signal 140 is indicative of the addressable memory cell in the data storage region selected from the memory 3. In this instance, the data storage region includes 512 memory cells, and, accordingly, the bit address represented by the bit address signal is incremented from zero to 511. Thus, the bit address generator 2 sequentially specifies the addressable memory cells in the selected data storage region in response to the clock signal 103.

The memory 3 includes n data storage regions, which are labeled with "0", "1", . . . and "n" in the right side of the box labeled with reference numeral 3 in FIG. 2. Block addresses "0" to "n" are respectively assigned the data storage region "0" to "n", and, accordingly, the address signal 102 is indicative of the block address "0", "1", . . . or "n". The memory cells are arranged in rows and columns in the memory 3, and the rows serve as the data storage regions "0" to "n", and 512 bit lines are connected to the columns of memory cells, respectively. As will be described hereinlater in detail, 512 data bits are successively written in the 512 memory cells of the selected data storage region without any serial-to-parallel data conversion, and the 512 data bits are concurrently read out from the selected data storage region to the 512 bit lines.

The control signal 104 and the clock signal 103 are supplied to the parallel-to-serial converter 4. The control signal 104 is representative of one of the data write-in/data read-out modes as described hereinbefore. The parallel-to-serial converter 4 is responsive to the control signal 104 representative of the data read-out mode so as to output 512 data bits in synchronism with the clock pulses of the clock signal 103. In detail, the parallel-to-serial converter 4 is connected to the bit lines of the memory 3. When one of the data storage regions "0", "1", . . . and "n" is selected from the memory 3, the 512 data bits are concurrently read out from the selected data storage region, and the read-out data bits are supplied from the selected data storage region through the bit lines to the parallel-to-serial converter 4. The control signal 104 representative of the read-out mode has established the parallel-to-serial converter 4 in the read-out mode, and 512 read-out data bits are stored in the parallel-to-serial converter 4. The parallel-to-serial converter 4 is responsive to the clock signal 103 so as to output the data bits in serial to the outside of the packet transmission memory. On the other hand, while the control signal 104 is indicating the data write-in mode, the parallel-to-serial converter 4 enters high-impedance state.

The packet transmission memory according to the present invention is designed to offer the data accumulation facility to 53 bytes of ATM (Asynchronous Transfer Mode) cells at high speed. The data bits of the digital signal are directly written in the selected data storage region by sequentially incrementing the bit address. Any serial-to-parallel converter is not required for the data write-in operation. For this reason, the circuit arrangement of the packet transmission memory according to the present invention is simpler than that of the prior art packet transmission memory, and the packet transmission memory according to the present invention consumes the real estate of the semiconductor chip rather narrower than the real estate occupied by the prior art packet transmission memory. Since the serial-to-parallel data conversion is deleted from the data write-in operation, the packet transmission memory according to the present invention achieves a high data write-in speed.

Figure 3:
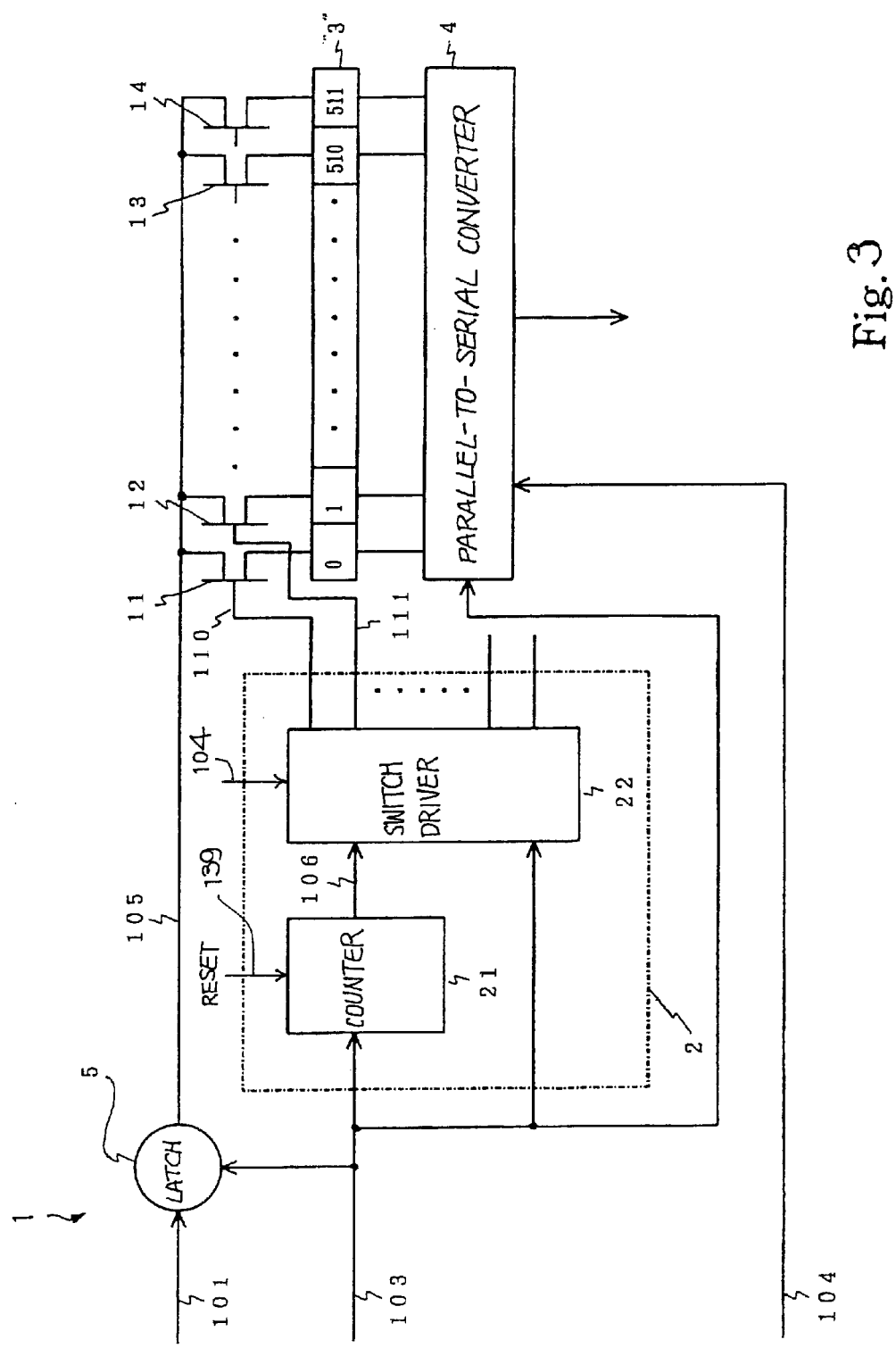
FIG. 3 is a block diagram showing a data propagation path of the packet transmission memory in a data write-in mode of operation.

FIG. 3 shows a data propagation path created in the packet transmission memory according to the present invention on the assumption that the address signal 102 is indicative of the data storage region "3". The latch circuit 5 and a selector, i.e., an array of switching transistors 11, 12, . . . , 13 and 14 are incorporated in the data distributor 1. The bit address generator 2 includes a 9-bit counter 21 and a switch driver 22. The counter 21 and the parallel-to-serial converter 4 are popular to persons skilled in the art, and no further description is hereinbelow made on the circuit configurations of these circuits for the sake of simplicity.

The latch circuit 5 is responsive to the clock signal 103 so as sequentially to latch the data bits of the digital data signal 101. The latch circuit 5 is connected through a data propagation line 105 to the source nodes of the switching transistors 11, 12, . . . , 13 and 14, and the switching transistors 11, 12, . . . , 13 and 14 are connected at the drain nodes thereof to the bit lines. The switch driver 22 is connected to the gate electrodes of the switching transistors 11, 12, . . . , 13 and 14 through address signal lines 110, 111, . . . , and the bit address signal 140 is supplied from the switch driver 22 through the address signal lines 110, 111, . . . to the gate electrodes of the switching transistors 11, 12, . . . 13 and 14. The switch driver 22 changes one of the switching transistors 11, 12, . . . , 13 and 14 from the off-state to the on-state, and remains the other switching transistors in the off-state.

The reset signal 139 and the clock signal 103 are supplied to the counter 21. When the reset signal 139 is changed to the active level, the counter 21 is reset to the initial value zero. The counter 21 is responsive to the clock signal 103 so as to increment the stored value from zero to 511. The counter 21 is connected through a signal line 106 to the switch driver 22, and a data signal representative of the stored value is supplied to the switch driver 22. The switch driver 22 is responsive to the data signal so as to change only one of the address signal lines 110, 111, to the active level. The address signal line in the active level causes the associated switching transistor to turn on. While the counter 21 is incrementing the stored value in response to the clock signal 103, the switch driver 221 sequentially changes the address signal lines 110, 111, . . . to the active level, and, accordingly, the associated switching transistors 11, 12, . . . , 13 and 14 sequentially turn on. Since the data bits are latched by the latch circuit 5 in response to the clock signal 103, the data bits are sequentially transferred through the switching transistors 11, 12, . . . , 13 and 14 to the bit lines, and are stored in the memory cells of the selected data storage region "3".

While the selector, i.e., the array of switching transistors 11, 12, . . . , 13 and 14 is distributing the data bits to the bit lines, the control signal 104 keeps a certain potential level representative of the write-in mode, and puts the parallel-to-serial converter 4 in the high-impedance state. For this reason, the data bits are respectively written in the memory cells of the data storage region "3". On the other hand, when the control signal 104 is changed to the potential level representative of the read-out mode, the parallel-to-serial converter 4 is enabled, and the switch driver 22 keeps all the address signal lines 110, 111, . . . in the inactive level. For this reason, the read-out data bits are surely stored in the parallel-to-serial converter 4.

Figure 4:
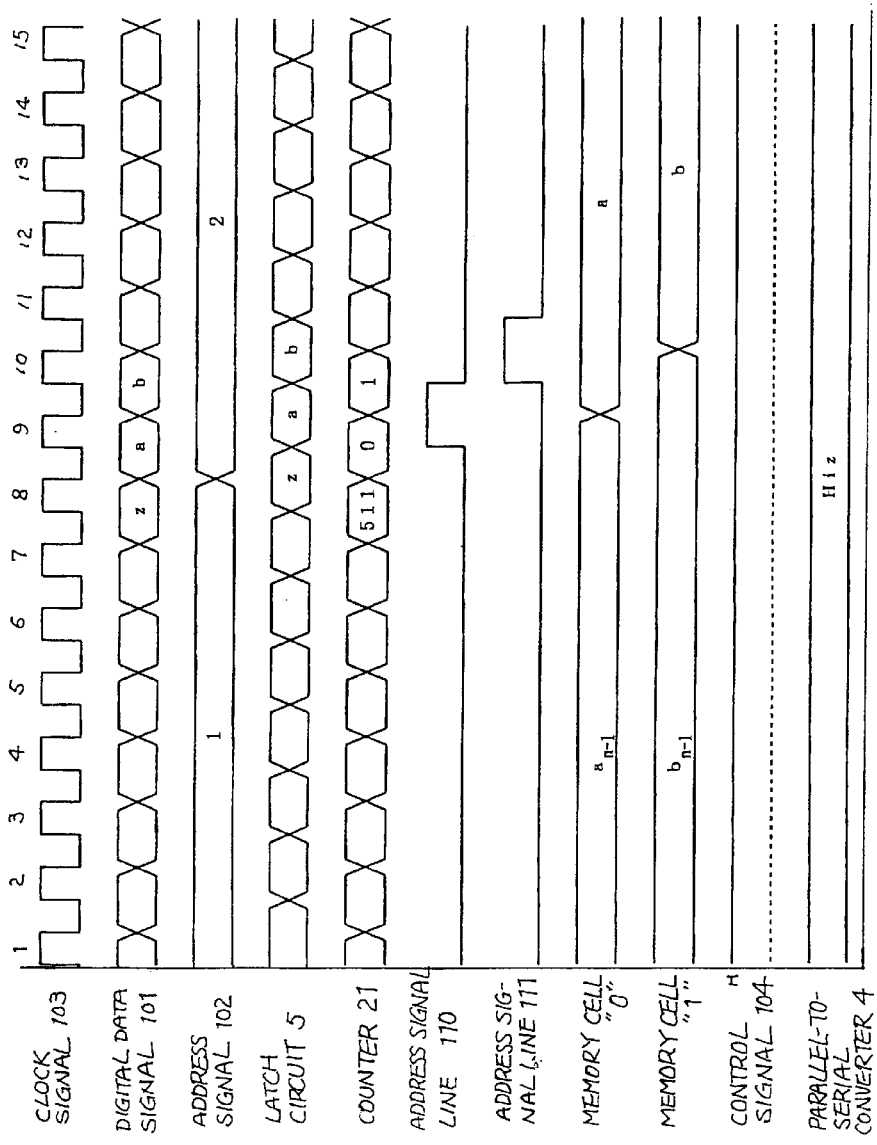
FIG. 4 is a timing chart showing the waveforms of essential signals in the packet transmission memory in the data write-in mode.

Description is hereinbelow made on a data write-in operation and a data read-out operation on the packet transmission memory. FIG. 4 illustrates the data write-in operation, and FIG. 5 illustrates the data read-out operation.

Figure 5:
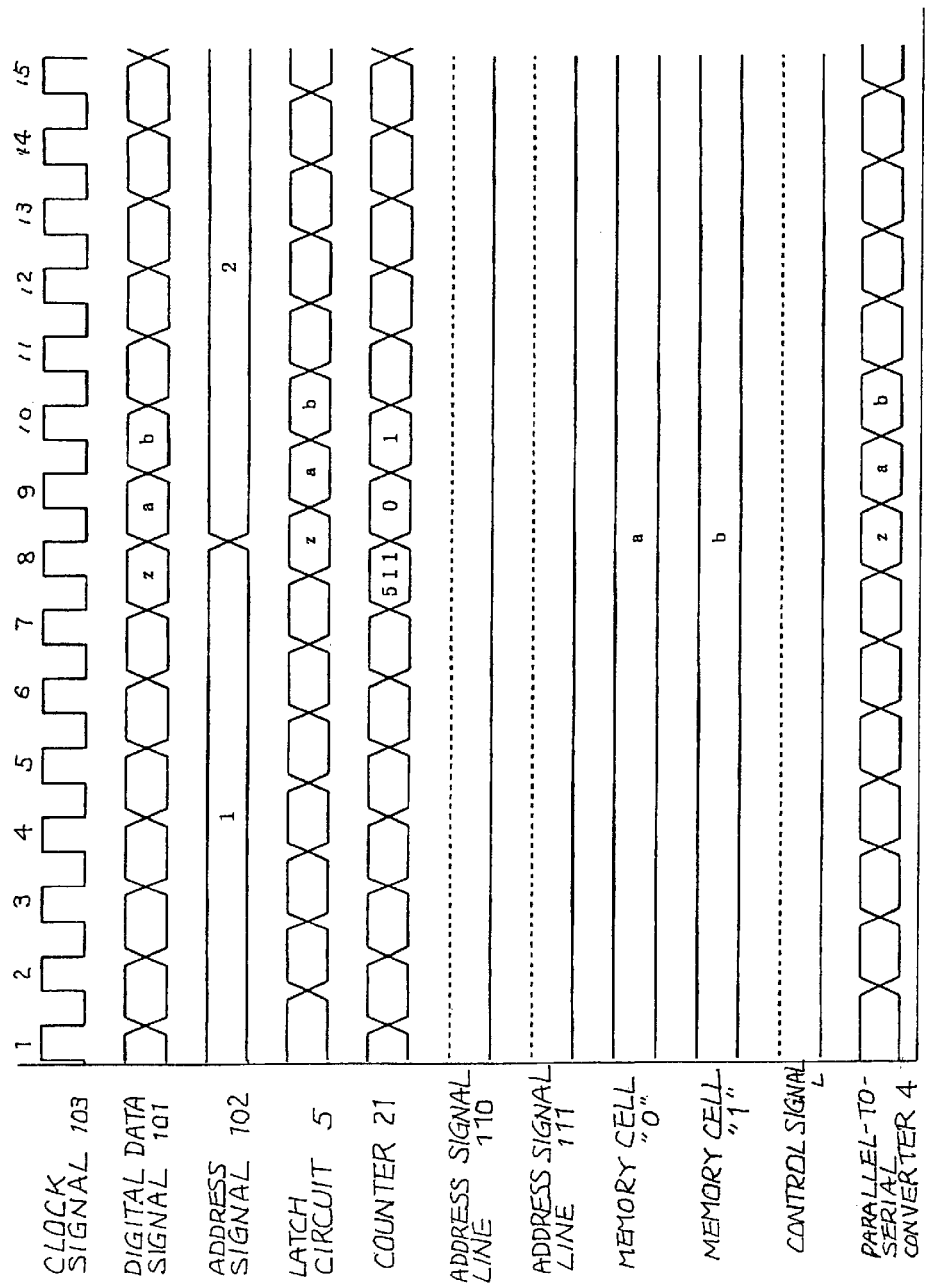
FIG. 5 is a timing chart showing the waveforms of the essential signals in the packet transmission memory in a data read-out mode.

As shown in FIGS. 4 and 5, the clock signal 103 repeatedly rises and falls so as to generate the clock pulses. In the following description, the leftmost clock pulse is referred to as "the first clock pulse", and the other pulses are numbered toward the rightmost clock pulse as "the second clock pulse", "the third clock pulse", . . . and "the fifteenth clock pulse".

The control signal 104 is assumed to be at the high level representative of the data write-in mode of operation (see FIG. 4). The parallel-to-serial converter 4 enters the high impedance state "Hiz", and remains inactive in the data write-in operation. The address signal 102 is indicative of the data storage region "1" through the first clock pulse to the eighth clock pulse, and the data distributor 1 selects the data storage region "1" from the memory 3. While the address signal 102 is keeping the address "1", the bit address generator 2 sequentially increments the bit address, and the data bits are written into the memory cells of the data storage region "1". When the eighth clock pulse rises, the data bit "z" is latched by the latch circuit 5, and the data bit "z" is supplied through the data propagation line 105. The counter 21 has incremented the stored value to "511", and the switch driver 22 causes the switching transistor 14 to turn on. For this reason, the data bit "z" is written in the memory cell 511 of the data storage region "1" (not shown in FIG. 4).

When the eighth clock pulse is decayed, the address signal 102 changes the address from "1" to "2". The data distributor 1 disables the data storage region "1", and enables the data storage region "2". Moreover, the data distributor 1 changes the reset signal 139 to the active level (not shown in FIG. 4), and the counter 21 is reset to "0". The control signal 104 still keeps the potential level at the high level, and the packet transmission memory restarts the data write-in operation on the data storage region "2".

The data signal 101 changes the data bit from "z" to "a", and the data bit "a" is latched by the latch circuit 5 at the pulse rise of the ninth clock pulse. The data bit "a" is supplied from the latch circuit 5 through the data propagation line 105 to the selector. Since the counter 21 keeps the value "0", and the switch driver 22 changes the address signal line 110 to the active high level, and, accordingly, the switching transistor 11 turns on. For this reason, the data bit "a" passes through the switching transistor 11, and is written into the memory cell 0 of the data storage region "2". Thus, the data bit "a" is stored in the memory cell "0" of the data storage region "2" at the pulse decay of the ninth clock pulse as shown in FIG. 4.

The ninth clock pulse is decayed, and the data signal 101 changes the data bit from "a" to "b". The data bit "b" is latched by the latch circuit 5 at the pulse rise of the tenth clock pulse. The data bit "b" is supplied from the latch circuit 5 through the data propagation line 105 to the selector. The counter 21 was incremented to "1" at the pulse decay of the ninth clock pulse. The switch driver 104 changes the address signal line 110 from the active high level to the inactive low level at the pulse rise of the tenth clock pulse, and address signal line 111 from the inactive low level to the active high level, concurrently. The inactive address signal line 110 causes the switching transistor 11 to turn off, and the active address signal line 111 causes the switching transistor 12 to turn on. The data bit "b" passes through the switching transistor 12, and is stored in the memory cell "1" of the data storage region "2". For this reason, the data bit "b" is staying in the memory cell "1" from the pulse decay of the tenth clock pulse as shown in FIG. 4.

When the control signal 104 is changed to the low level representative of the data read-out operation, the parallel-to-serial converter 4 is enabled, and the switch driver 104 keeps all the address signal lines 110, 111, . . . at the inactive level. For this reason, all the switching transistors 11, 12, . . . , 13 and 14 are turned off in the data read-out operation, and any data bit on the data propagation line 105 is not written into the memory cells. For this reason, the memory cells "0" and "1" of the data storage region "2" keeps the data bits "a" and "b" in the data read-out operation as shown in FIG. 5.

The address signal 102 is indicating the address assigned to the data storage region "1" until the eighth clock pulse. The address signal changes the address from "1" to "2" at the pulse decay of the eighth clock pulse. The data distributor 1 changes the selected data storage region from "1" to "2", and all the data bits are read out from the memory cells "0" to "511" to the associated bit lines, respectively. The data bit "a" is read out from the memory cell "0" of the data storage region "2" to the associated bit line, and the data bit "b" is read out from the memory cell "1" of the data storage region "2" to the associated bit line. All the data bits are concurrently stored in the parallel-to-serial converter 4.

The parallel-to-serial converter 4 is responsive to the clock signal 104 so as to serially output the data bits. When the ninth clock pulse rises, the data bit "a" is output from the parallel-to-serial converter 4. Subsequently, the tenth clock pulse rises. Then, the data bit "b" is output from the parallel-to-serial converter 4. The clock signal 103 repeats the potential rise and potential fall, and the remaining data bits are serially output from the parallel-to-serial converter 4.

In the above-described embodiment, the selector is corresponding to a data distributing circuit, and the data distributor 1 except for the selector serves as a data write-in unit.

As will be appreciated from the foregoing description, the bit address signal is sequentially changed inside of the packet transmission memory according to the present invention, and the data bits serially supplied thereto are written into the memory cells of the selected data storage region. Any serial-to-parallel converter is not required for the packet transmission memory according to the present invention. Thus, the serial-to-parallel converter is deleted from the packet transmission memory, and the circuit arrangement is simpler than that of the prior art packet transmission memory. This results in a narrow occupation area on the semiconductor chip.

Moreover, the data bits are directly written into the memory cells of the selected data storage region without any serial-to-parallel data conversion. This results in acceleration of the data write-in operation. Thus, the packet transmission memory according to the present invention achieves a high data write-in speed.

Although the particular embodiment of the present invention have been shown and described, it will be apparent to those skilled in the art that various changes and modifications may be made without departing from the spirit and scope of the present invention.

A packet transmission memory according to the present invention may be implemented by a hybrid circuit.

The data blocks stored in the packet transmission memory are never limited to the ATM cells. Any kinds of packets are storeable in the packet transmission memory according to the present invention.

The events at the pulse rise and the events at the pulse decay may take place at the pulse decay and the pulse rise in the data write-in and data read-out operations.

What is claimed is:

1. A memory for readably storing data bits of packets therein, comprising:

plural addressable data storage regions each having plural memory cells;

a data distributing circuit connected to said plural addressable data storage regions, and responsive to an internal address signal selectively specifying the plural memory cells of an addressable data storage region selected from said plural addressable data storage regions for providing a data path to the memory cell specified by said internal bit address signal, and responsive to an external address signal selectively enables said plural addressable data storage regions, wherein said data distributing circuit successively receives data bits of a received packet;

an internal address generator for supplying said internal address signal to said data distributing circuit; and a parallel-to-serial converter connected to said plural addressable data storage regions, storing the data bits read out from an addressable data storage region selected from said plural addressable data storage regions, and serially outputting said data bits to the outside, wherein a clock signal makes said data distributing circuit and said internal address generator synchronous with each other, wherein said data distributing circuit includes a temporary data storage circuit responsive to said clock signal for successively storing said data bits of said received packet, and said internal address generator is responsive to said clock signal so as to sequentially changing said internal address signal, wherein said internal address generator includes
a counter responsive to said clock signal for incrementing a stored value, and
a driver connected between said counter and said data distributing circuit and responsive to said clock signal so as to change the internal address of said internal address signal on the basis of said stored value.

2. The memory as set forth in claim 1, in which said data distributing circuit includes plural switching elements connected between said temporary data storage circuit and the plural memory cells of said plural addressable data storage regions and responsive to said internal address signal so as to be selectively changed to on-state.

3. The memory as set forth in claim 2, in which said internal address signal has plural signal bits respectively supplied to said plural switching elements.

4. The memory as set forth in claim 1, in which 512 data bits are stored in each of said plural addressable data storage regions.

5. The memory as set forth in claim 1, in which said packets are asynchronous transfer mode cells each having 53 data bytes.

6. A memory for readably storing data bits of packets therein, comprising:

plural addressable data storage regions each having plural memory cells;

a data distributing circuit connected to said plural addressable data storage regions, and responsive to an internal address signal selectively specifying the plural memory cells of an addressable data storage region selected from said plural addressable data storage regions for providing a data path to the memory cell specified by said internal bit address signal, and responsive to an external address signal selectively enables said plural addressable data storage regions, wherein said data distributing circuit successively receives data bits of a received packet;

an internal address generator for supplying said internal address signal to said data distributing circuit; and a parallel-to-serial converter connected to said plural addressable data storage regions, storing the data bits read out from an addressable data storage region selected from said plural addressable data storage regions, and serially outputting said data bits to the outside, wherein said parallel-to-serial converter is responsive to a control signal selectively indicating a data write-in mode and a data read-out mode so as to be enabled for serially outputting said data bits and disabled in high impedance state, wherein said control signal is further supplied to said data distributing circuit so as to generate said internal address signal in the presence of said control signal indicating said data write-in mode and keeps said internal address signal inactive in the presence of said control signal indicating said data read-out mode.

7. A method for writing data bits of a packet in and reading out said data bits from a data storage region having memory cells of a memory, comprising the steps of:

a) selecting said data storage region from said memory;

b) receiving the first data bit of said packet;

c) providing a data path to one of the memory cells of said data storage region for storing said first data bit in said one of said memory cells;

d) receiving the next data bit of said packet;

e) changing said data path from said one of said memory cells to another of said memory cells for storing said next data bit in said another of said memory cells;

f) repeating said steps d) and e) until the last data bit of said packet is stored in a memory cell of said data storage region;

g) concurrently reading out said data bits of said packet from said memory cells of said data storage region;

h) storing said data bits in a parallel-to-serial converter; and i) serially outputting said data bits from said parallel-to-serial converter, wherein said first data bit is temporarily stored in a data storing circuit in said step b) so as to transfer said first data bit toward said memory, and said step c) includes the sub-steps of c-1) generating an internal address signal representative of said one of said memory cells, and c-2) creating said data path in a switching element connected to said one of said memory cells so as to permit said first data bit to reach said one of said memory cells, wherein said step b) is carried out at one of the pulse rise and the pulse decay of a clock signal, and said step c-2) is carried out at the other of said pulse rise and said pulse decay of said clock signal.

8. The method as set forth in claim 7, wherein said internal address signal is changed in said step e) so as to create said data path in another switching element connected to said another of said memory cells.

9. The method as set forth in claim 7, in which said data bits are serially output from said parallel-to-serial converter in synchronism with one of the pulse rise and the pulse decay of a clock signal.

10. The method as set forth in claim 7, in which said packet is an asynchronous transfer mode cell.

11. The method as set forth in claim 10, in which said asynchronous transfer mode cell has said data bits equal to 53 bytes.

* * * * *